United States Patent [19]

Nogami

[11] Patent Number: 4,759,681

[45] Date of Patent: Jul. 26, 1988

[54] END STATION FOR AN ION IMPLANTATION APPARATUS

[75] Inventor: Mamoru Nogami, Uji, Japan

[73] Assignee: Nissin Electric Co. Ltd., Kyoto, Japan

[21] Appl. No.: 819,253

[22] Filed: Jan. 16, 1986

[30] Foreign Application Priority Data

Jan. 22, 1985 [JP] Japan .................................. 60-10616
Jan. 26, 1985 [JP] Japan .................................. 60-9535
Apr. 11, 1985 [JP] Japan .................................. 60-54634

[51] Int. Cl.$^4$ .......................................... B65G 47/24
[52] U.S. Cl. ................................... 414/417; 414/404; 414/278; 414/331; 414/222; 414/416; 414/744 B; 118/500; 118/730
[58] Field of Search .............. 414/403, 404, 416, 417, 414/217, 222, 223, 224, 225, 744 B, 331, 278, 662; 118/500, 728, 729, 730

[56] References Cited

U.S. PATENT DOCUMENTS

| | | | |
|---|---|---|---|
| 3,902,615 | 9/1975 | Levy et al. | 414/416 X |
| 3,921,788 | 11/1975 | Robertson, Jr. et al. | 414/417 X |
| 4,178,113 | 12/1979 | Beaver II et al. | 414/270 X |
| 4,293,249 | 10/1981 | Whelan | 414/217 X |
| 4,336,438 | 6/1982 | Uehava et al. | 414/222 X |
| 4,378,189 | 3/1983 | Takeshita et al. | 414/331 X |
| 4,388,034 | 6/1983 | Takahashi | 414/331 |
| 4,483,651 | 11/1984 | Nakane et al. | 414/222 X |
| 4,529,353 | 7/1985 | Dean et al. | 414/404 X |

FOREIGN PATENT DOCUMENTS 58-214260 12/1983 Japan .

Primary Examiner—Frank E. Werner
Attorney, Agent, or Firm—Sandler & Greenblum

[57] ABSTRACT

An end station for ion implantation apparatus comprising an ion implantation process unit having a wafer holder and capable of implanting ions in wafers in a high vacuum, and a wafer supply-collection unit for the process unit. The wafer supply-collection unit comprises:

(a) a plurality of cassettes being capable of accommodating wafers in a plurality of stages,
(b) devices for lifting and lowering the cassette for delivering or accommodating wafers one by one,
(c) stockers equal in number to the number of cassettes for accommodating wafers in a plurality of stages and for accommodating dummy wafers when required,
(d) devices for lifting and lowering the stocker for accommodating or delivering wafers one by one,
(e) devices extending from the cassette to the ion implantation process station via the stocker and capable of transporting wafers in the direction of reciprocation, and
(f) control devices for controlling the operation of the devices described in (b), (d) and (e) above for collecting the wafer from the desired cassette and replacing in the same original supply cassette at its original position after processing thus, enabling the wafer production line to achieve an improved operation efficiency.

17 Claims, 7 Drawing Sheets

END STATION FOR AN ION IMPLANTATION APPARATUS

BACKGROUND OF THE INVENTION

1. Field of the Invention

The present invention relates to improvements in a unit for supplying wafers to an ion implantation process unit and collecting the processed wafers therefrom for use in ion implantation end stations.

2. Description of the Prior Art

Conventional end stations for ion implantation apparatus generally comprise a unit for supplying unprocessed wafers onto a disk and a unit disposed adjacent the supply unit for collecting ion-implanted wafers from the disk as disclosed in Unexamined Japanese Patent Publication No. SHO 58-214260. This arrangement is disadvantageous because of the following reason: the number of wafers (10 to 30) accommodated in a cassette set in the wafer supply unit is generally larger than the number of wafers (5 to 20) that may be set in a disk, thus difficulties are encountered in (a) wafer transport means mechanism in collecting processed wafers in the cassette wherein the unprocessed wafers remain, (b) further supplying unprocessed wafers to the disk, and (c) finally, collecting all the processed wafers and returning them to the original supply cassette. However, for the identification of wafers, the production line including an ion implantation apparatus must specify the wafers to be accommodated in a specified cassette at all times. This has become an important problem in recent years, since a wide variety of wafers are produced in smaller quantities. Therefore, when required, the processed wafers in the cassette in the collection unit are usually placed into an empty cassette in the supply unit and then fed in to the production line, thereby requiring much labor and results in higher production costs.

SUMMARY OF THE INVENTION

The present invention provides an end station for an ion implantation apparatus which comprises an ion implantation process unit having a wafer holder and capable of implanting ions in wafers in a high vacuum, and a wafer supply-collection unit for the process unit. The wafer supply-collection unit comprises:

(a) a plurality of cassettes being capable of accommodating wafers in a plurality of stages,
(b) means for lifting and lowering the cassette for delivering or accommodating wafers one by one,
(c) stockers equal in number to the number of cassettes for accommodating wafers in a plurality of stages and for accommodating dummy wafers when required,
(d) means for lifting and lowering the stocker for accommodating or delivering wafers one by one,
(e) means extending from the cassette to the ion implantation process station via the stocker and capable of transporting wafers in the direction of reciprocation, and
(f) control means for controlling the operation of the means outlined at (b), (d) and (e) above for collecting the wafers from the desired cassette and replacing them in their original positions in the same cassette after processing.

The present invention makes it possible to supply wafers from a cassette to the ion implantation process unit and to collect the wafers in the same cassette from the process unit after ion implantation, thus contributing to improvements in the operation efficiency of the wafer production line.

BRIEF DESCRIPTION OF THE DRAWINGS

FIGS. 3 (*a*) and (*b*) are diagrams illustrating supply of dummy wafers;

DESCRIPTION OF THE PREFERRED EMBODIMENTS

The general features of the invention will be described first. The control means comprises, for example, a microcomputer. The means for lifting and lowering the cassette and the stocker are operated as associated with the wafer transport means in a specified sequence so that the ion-implanted wafer is collected in the original cassette from which it was supplied, and placed in its original position within the cassette.

The ion implantation process unit defines a site where ions are implanted in wafers. At this site, a holder is provided for wafers in which ions are to be implanted. The holder may be a disk for holding a plurality of wafers or a platen for holding a single wafer.

Each cassette and the stocker has a rack structure and is shaped in conformity with the wafer transport means for the supply and collection of wafers. Preferably, the rack is provided with means for stably holding the wafers.

The means for lifting and lowering the cassette and the stocker comprises a lift portion for lifting and lowering the same, and a driver, such as a motor, for operating the lift portion.

The means for transporting wafers may be a belt for transporting the wafer as placed thereon.

Preferred embodiments of the invention are described below with reference to the drawings, but it should be understood that the invention is not limited to these embodiments.

Figure 1:
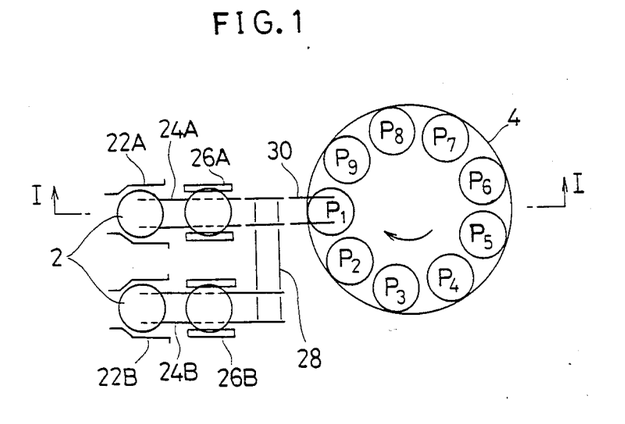
FIG. 1 is a schematic plan view showing an ion implantation end station embodying the invention.
Figure 2:
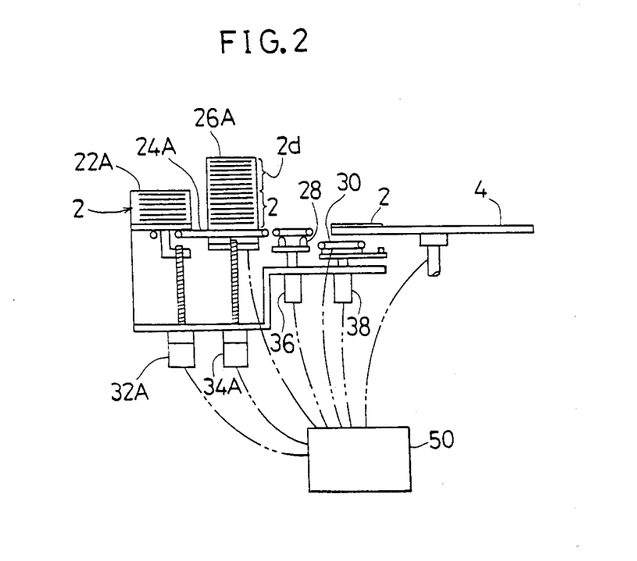
FIG. 2 is a schematic view in section taken along the line I—I in FIG. 1.

FIG. 1 is a schematic plan view of an end station for illustrating an example of the method for handling wafers according to the invention. FIG. 2 is a schematic view in section taken along the lines I—I in FIG. 1. In this case, wafers are handled in the atmosphere. Thus, the pair of cassette 22A of rack structure and stocker 26A of rack structure (referred to as "stage A"), the pair of cassette 22B of rack structure and stocker 26B of rack structure (referred to as "stage B"), etc. are provided in the atmosphere. A disk 4 is transferred from a vacuum into the atmosphere when wafers 2 are supplied and delivered.

Each of the cassettes 22A 22B has a plurality of (e.g. 25) untreated wafers 2 accommodated therein for ion implantation. Each of the stockers 26A and 26B, disposed between the disk 4 and the cassettes 22A and 22B, has accommodated its upper shelves or in upper stages with a plurality of dummy wafers 2d, i.e., dummy wafers equal in number to the number of wafers 2 to be set on the disk 4 (e.g. 9). Moreover, each stocker 26A and 26B can further accommodate in its lower stages as shelves wafers 2 which are greater or equal to the number of wafers 2 to be accommodated in the cassette 22A or 22B of the pair (e.g. 25 wafers).

Wafers 2 are delivered from the cassette 22A and collected therein by lifting or lowering the cassette 22A stepwise by lift means 32A comprising a motor serving as a driver, etc., and driving a conveyor belt 24A forward or backward. The belt serves as transport means. Wafers 2 are accommodated in the stocker 26A, and wafers 2 and dummy wafers 2d are delivered thereform, by lifting or lowering the stocker 26A stepwise by lift means 34A comprising a motor as a driver, etc., and driving the transport belt 24a, serving as transport means, forward or backward. Wafers 2 and dummy wafers 2d are loaded or unloaded onto the disk 4 by lifting a transport belt 30 as transport means by lift means 38 comprising an actuator, etc., driving the belt 30 forward or backward and rotating the disk 4 intermittently. While the cassette 22B and the stocker 26B are operated in the same manner as above, a transport belt 28 serving as transport means is lifted by lift means 36 comprising an actuator, etc., when wafers 2 or dummy wafers 2d are to be transported therefrom.

At the end station, wafers are handled in the following manner. First, two cassettes 22A, 22B containing untreated wafers 2 are set in position. The wafers 2 are delivered from the lower shelves of the cassette 22A one by one and successively placed into the stocker 26A immediately below dummy wafers 2d. Thus, all the wafers 2 in the cassette 22A are transferred to the stocker 26A. Similarly, wafers 2 within the cassette 22B are all transferred to the stocker 26B to temporarily empty the cassettes 22A, 22B. During the above operation, the cassettes 22A, 22B are gradually lowered by the lift means 32A and 32B and the stockers 26A, 26B are gradually raised by the lift means 34A and 34B. During this movement, the transport belts 24A and 24B transport the wafers successively, as placed thereon.

Next, while the stocker 26A is being lowered gradually, wafers 2 are delivered from the lowermost position of the stocker 26A and supplied to the disk 4 in succession. The wafers 2 are loaded onto the disk 4 from position P1 to position P9. The disk 4 is thereafter placed into an implantation chamber (not shown) having a high vacuum for ion implantation. The transport belts 24A and 30 are used for the transport of wafers 2.

After the ion implantation, the disk 4 is returned to the atmosphere, the ion-implanted wafer 2 is delivered from the disk 4 at the position P1, passed through a space in the stocker 26A and collected onto upper-most shelf of the original cassette 22A. The next wafer 2 in the stocker 26A is loaded onto the disk 4 at the position P1. The above procedure is repeated for the positions P2 to P9 of the disk 4, followed by the second operation of ion implantation. In this case, the processed wafers 2 are recollected in the cassette from which they were supplied, each in its original position in the cassette (i.e., in the same order as previous accommodation). Thus, when wafers are delivered from the cassette or stocker, the cassette or stocker is gradually lowered, while it is conversely gradually lifted when receiving wafers.

When the stocker 26A is empty of wafers 2, this condition is detected, for example, by a photosensor or the like, and the unprocessed wafers 2 are supplied to the disk 4, for example, from the stocker 26B. When the cassette is filled with ion-implanted wafers 2, this also is detected, for example, by a photosensor or the like. The processed wafers 2 from the disk 4 are automatically collected in the cassette 22B, and a signal is emitted for the replacement of the cassette 22A.

In response to the signal, the operator removes the cassette 22A having the processed wafers 2 contained therein, and another cassette 22A containing unprocessed wafers 2 is set in position, whereupon the wafers 2 are automatically transferred to the stocker 26A as stated above and made available for delivery. Concurrently with this, wafers 2 are supplied from the stocker 26B, followed by ion implantation and collection of wafer 2 in the cassette 22B.

When dummy wafers are to be used due to the insufficient supply of wafers 2 on to the disk 4, dummy wafers 2d are supplied to the disk 4 from upper shelves of the stocker 26A or 26B, and are returned to the same original stocker (as used for the supply) after ion implantation. For this purpose, identification of the supplying stocker for dummy wafers 2d and the number of dummy wafers supplied, etc., are stored in the control means.

Figure 3:
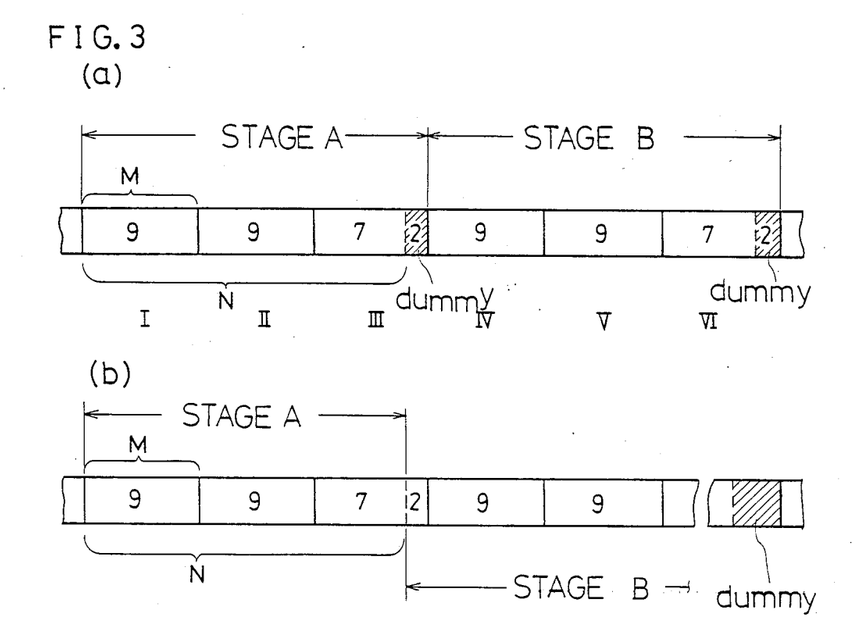

In this case, when there are at least two stages of cassettes and stockers in pairs (FIGS. 1 and 2 show two stages), there are various methods of supplying dummy wafers 2d from a particular stage or supplying wafers 2 from another stage in the event there is a shortage of wafers to be supplied to the disk 4. FIG. 3 shows typical examples. Suppose the number of wafers to be loaded onto the disk is M (e.g., 9), and the number of wafers accommodated in each stage is N (e.g., 25). FIG. 3 (a) shows a case in which each time the supply of wafers 2 in one stage to the disk 4 is insufficient, the deficiency is satisfied by supplying the dummy wafers 2d in that stage. For example, nine wafers 2 are supplied to the disk 4 from the stocker 26A of stage A for each operation of ion implantation I and II, and seven wafers 2 and two dummy wafers 2d are supplied from the stocker 26A for ion implantation III. Subsequently, wafers 2 or dummy wafers 2d are supplied from the stage B similarly.

FIG. 3 (b) shows another case in which when a shortage of wafers 2 from one stage occurs, the deficiency is satisfied by supplying wafers 2 from another stage, and after ion implantation, dummy wafers 2d are supplied collectively.

Which of the two methods should be used is dependent on implantation conditions, etc. For example, when different implantation conditions are adopted for different cassettes, the method of FIG. 3 (a) may be used. When ions are to be implanted in a large number of wafers under the same conditions, the method of FIG. 3 (b) should be employed.

FIG. 2 shows control means 50 for sending control signals to each transport means, each lift means and the drive mechanism for the disk 4 in a predetermined sequence to handle wafers as stated above. The control means 50 of the present embodiment emits control signals so that the ion-implanted wafers 2 are delivered first from the position P1 on the disk 4. Thus, the processed wafers 2 can be collected in the original cassette from which they were supplied, each in its original location in the cassette.

Figure 4:
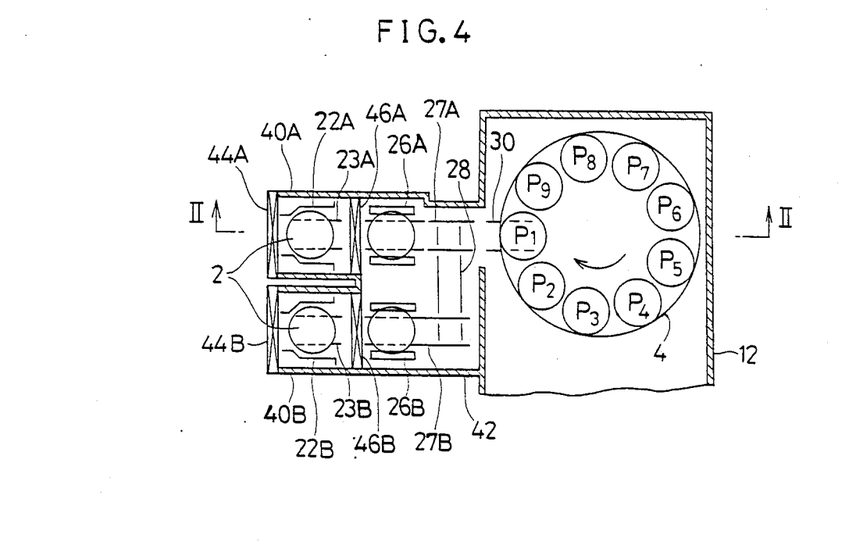
FIG. 4 is a view corresponding to FIG. 1 and showing another embodiment of the invention.
Figure 5:
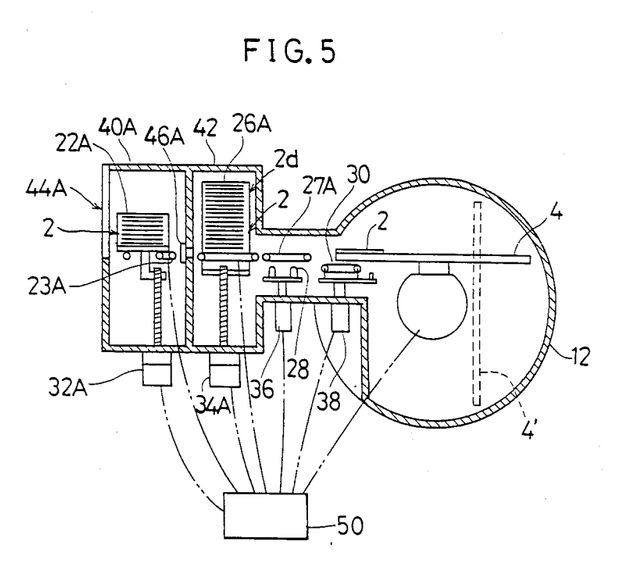
FIG. 5 is a view corresponding to FIG. 2 and showing the embodiment of FIG. 4.

Next, a description will be made of a case wherein wafers are handled in a vacuum. FIG. 4 is a schematic plan view of another end station for illustrating another method of handling wafers according to the invention. FIG. 5 is a schematic sectional view taken along the line II—II in FIG. 4. Throughout FIGS. 1, 2, 4 and 5, like parts are designated by like reference numerals or symbols and will thus not be described.

The disk 4 is provided in a vacuum container 12 having a high vacuum ($10^{-6}$ to $10^{-7}$ torr) and communicating with an implantation chamber (not shown). The disk 4 is intermittently rotated in the solid-like position shown in FIG. 5 when handling wafers, or is rotated and translated in the broken-line position indicated at 4' in FIG. 5. The vacuum container 12 communicates directly with a transport chamber 42 without any gate valve or the like. The cassette chambers 40A, 40B having a high vacuum ($10^{-5}$ to $10^{-6}$) are provided between the transport chamber 42 and the atmosphere. The chambers 40A, 40B are provided with cassette doors 44A, 44B and gate valves 46A, 46B at their opposite sides. The cassettes 22A, 22B are accommodated in the chambers 40A, 40B, respectively. The stockers 26A, 26B are both accommodated in the transport chamber 42. The aforementioned transport belts 24A, 24B correspond to divided belts 23A, 27A and belts 23B, 27B, respectively.

Figure 6:
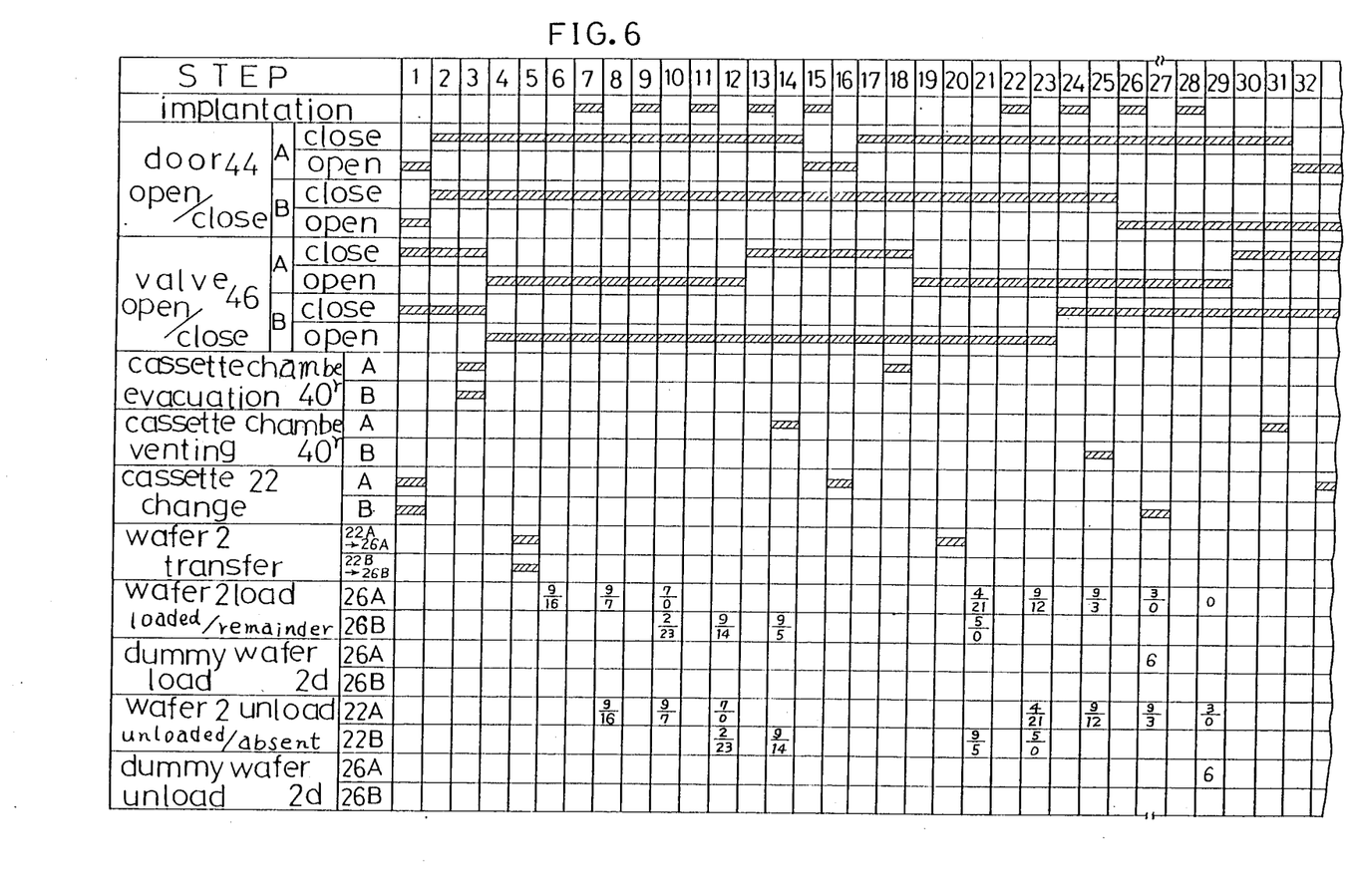
FIG. 6 is a diagram showing handling of wafers by the embodiment of FIGS. 4 and 5.

Wafers are handled at the end station in the following manner as will be described with reference to FIG. 6. Wafers 2 are transported substantially in the same manner as in the aforementioned embodiment. In step 1, the cassette doors 44A, 44B are opened, and cassettes 22A, 22B containing unprocessed wafers 2 are set in the end station. The doors 44A, 44B are closed in step 2. The cassette chambers 40A, 40B are evacuated in step 3. The gate valves 46A, 46B are opened in step 4. All wafers 2 are transferred from the cassettes 22A, 22B to the stockers 26A, 26B in step 5. In step 6, nine wafers 2 are loaded onto the disk 4 from the stocker 26A. In step 7, ions are implanted in the wafers. Although not shown, the wafers 2 are held or supported by a retainer on the disk 4. In step 8, the ion-implanted wafers 2 are collected in the cassette 22A, while nine unprocessed wafers 2 are supplied from the stocker 26A to the disk 4. Ions are implanted in the wafers in step 9. In step 10, the processed wafers 2 are collected in the cassette 22A, while seven unprocessed wafers 2 are supplied from the stocker 26A to the disk 4. (In the present case, 25 wafers are accommodated in each of the cassettes 22A, 22B, so that only seven unprocessed wafers 2 remain in the stage concerned for the third loading.) The shortage, of two wafers, is satisfied from the stocker 26B of the other stage. Ion implantation is performed in step 11. In step 12, the seven processed wafers 2 are collected in the original cassette 22A, the two processed wafers 2 are collected in their original cassette 22B, and nine unprocessed wafers 2 are supplied from the stocker 26B to the disk 4. When ion implantation is complete, the gate valve 46A is closed in step 13. In step 14, wafers 2 are loaded and unloaded in the same manner as above, and nitrogen gas or the like is introduced into the cassette chamber 40A at the atmospheric pressure (venting). In step 15, ion implantation is completed and the cassette door 44A is opened. Finally, cassette 22A is changed in step 16. More specifically, the cassette 22A having the processed wafers 2 collected therein, is removed, and another cassette 22A containing unprocessed wafers 2 is set in position. The above procedure is thereafter repeated. In step 27, the remaining three wafers 2 are supplied from the stocker 26A to the disk 4, and six dummy wafers 2d are supplied from the stocker 26A to compensate for the deficiency. At this time, the wafers 2 and the dummy wafers 2d are collected in the original cassette 22A and the orignal stocker 26A. Thus, the dummy wafer supplying method of FIG. 3 (b) is used in the present case.

In the handling method described above, wafers are handled in a vacuum, so the method has a higher processing capacity than the method described with reference to FIGS. 1 and 2 in which disk 4 is transferred between a vacuum and the atmosphere.

In the present embodiment especially, the cassette chambers 40A, 40B are evacuated, with the cassettes 22A, 22B accommodated therein and with wafers 2 placed in the cassettes. This greatly shortens the processing time for each wafer 2, hence is desirable with respect to this operation efficiency.

Figure 7:
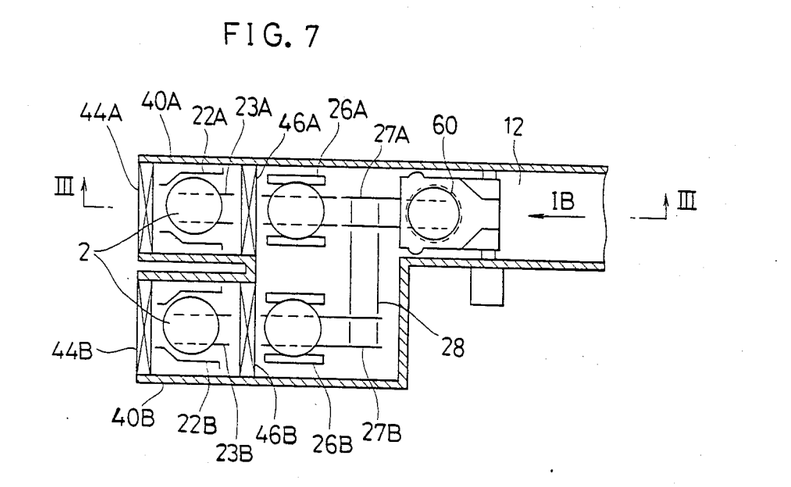
FIG. 7 is a view corresponding to FIG. 1 and showing another embodiment.
Figure 8:
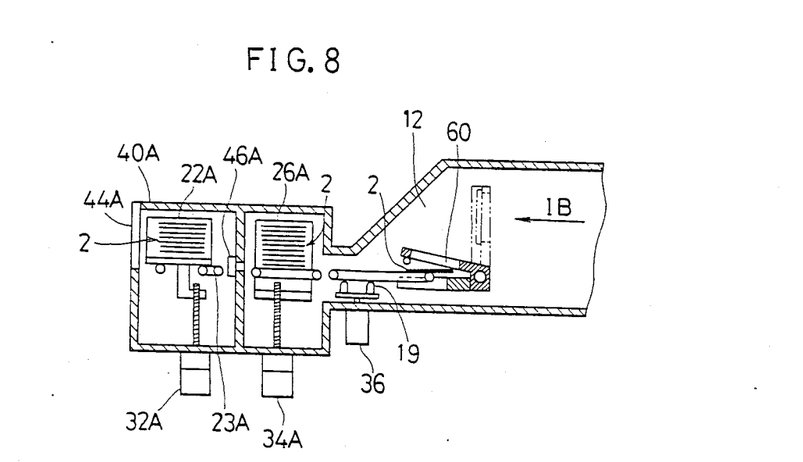
FIG. 8 is a view corresponding to FIG. 2 and showing the embodiment of FIG. 7.

Another embodiment will be described with reference to FIG. 7 and FIG. 8 which is a schematic view in section taken along the line III—III in FIG. 7. Throughout the several drawings, like parts are referred to by like numerals. This embodiment is similar to the second embodiment in that wafers 2 are handled in a vacuum, but the holder for wafers 2 is a platen 60 for holding wafers one by one, instead of the disk 4. In this embodiment, the ion-implanted wafers 2 on the platen 60 are passed through stockers 26a, 26b and collected in the cassettes 22a, 22b one after another, so that the number of wafers supplied is equal to the number of wafers collected, at all times. Accordingly, there is no need to use dummy wafers.

Figure 9:
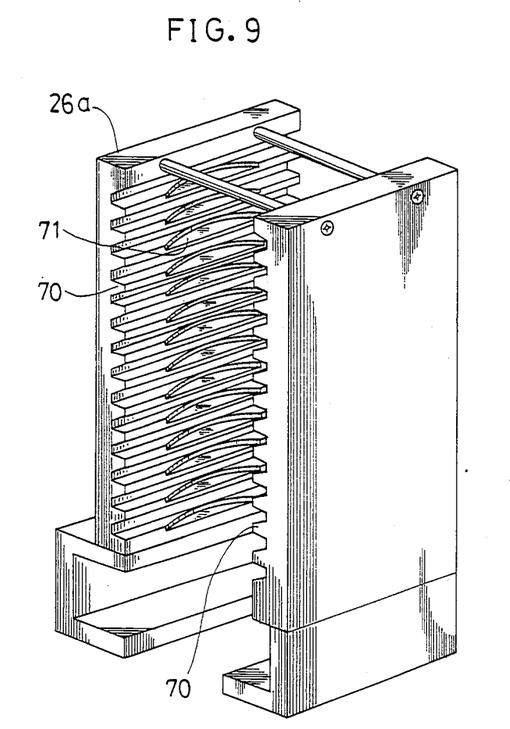
FIG. 9 is a perspective view showing a stocker in detail.
Figure 10:
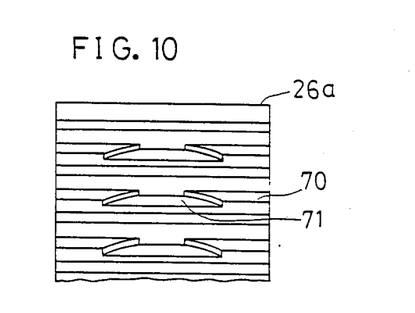
FIG. 10 is a fragmentary front view showing the stocker of FIG. 9.
Figure 11:
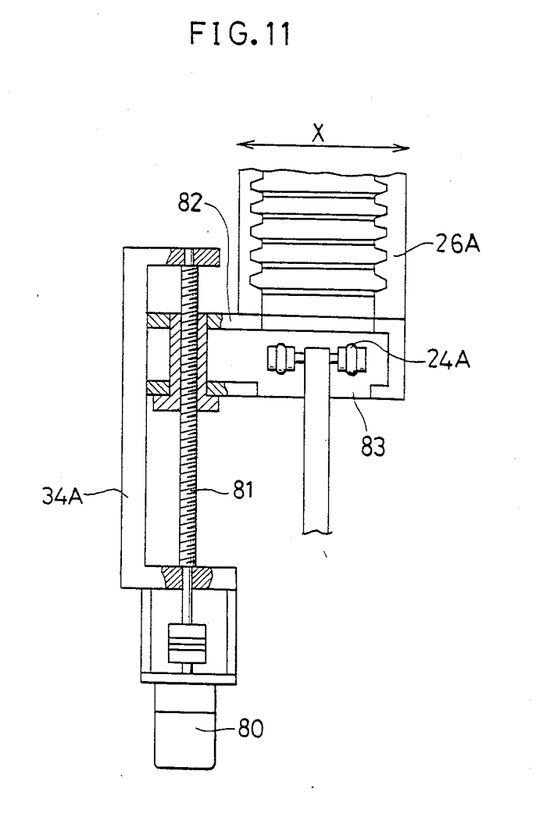
FIG. 11 is a front view showing the stocker and lift means therefor.

With reference to FIGS. 9, 10 and 11, the stocker and the lift means therefor use in this embodiment will be described. Throughout several drawings, like parts are designated by like reference numerals.

Like the cassette 22A, the stocker 26a is of rack structure and has oppositely positioned shelf portions 70, each formed with a circular arc recessed portion 71 for each end of the wafer 2 to fit in. Thus, the recessed portion 71 serves as means for stably retaining the wafer 2. With the opposite ends of the wafers 2 fitted in the recessed portions 71, there is no danger of the wafers 2 being displaced and falling off the shelf portions 70, even if the stocker 26a is shaken during a descent or ascent. The recessed portion 71 may also be formed in the cassette.

The lift means 34A comprises a motor 80 serving as drive means, and a screw portion 81 rotatable by the motor 80 and serving as lift portion. The screw portion 81 is in a screw-thread engagement with a lower portion 82 of the stocker 26A. When rotated forward or in reverse, the screw portion 81 lifts or lowers the stocker 26A, respectively. In corresponding relation with this movement of the stocker 26A, the transport belt 24A sends out a wafer 2 from the shelf portions 70 at a specified level while supporting the wafer thereon, or the belt 24A transfers a wafer onto the shelf portions 70. The cassette is lifted or lowered by the same arrangement as above, while the relation between the cassette and the transport belt is similar to the relation between the stocker and the transport belt.

The stocker 26a of a particular dimension X needs to be used for wafers 2 of a particular size. When the stocker has an open lower portion 83 as seen in FIG. 11, the stocker is easily separable from the transport belt 24A when released from the screw portion 81 and lifted. Thus, the stocker 26A is readily replaceable. The stocker can be made variable in dimension X.

ADVANTAGE OF THE INVENTION

Because of the foregoing features, the ion-implanted wafers can be collected into the original cassette in which they were accommodated and therefore, can be fed directly to a production line thereby, achieving a greatly improved operation efficiency. The present arrangement, furthermore, reduces the number of cassettes to be used for the production line, ensuring advantages in cost and work efficiency.

What is claimed is:

1. An end station for an ion implantation apparatus comprising an ion implantation process unit having a wafer holder, said unit being capable of implanting ions in wafers in a high vacuum, and a wafer supply-collection unit for the process unit, the wafer supply-collection unit comprising:
   (a) a plurality of cassettes comprising means for accommodating wafers in a plurality of first positions therein before ion implantation;
   (b) means for sequentially lifting and lowering each of said cassettes for delivery or for accommodating wafers individually;
   (c) a plurality of stockers equal in number to the number of cassettes for accommodating wafers from said cassettes in a plurality of positions therein, and for accommodating dummy wafers, which are not to be processed, when required;
   (d) means for sequentially lifting and lowering each of said stockers for accommodating or delivering wafers individually;
   (e) means for reciprocally transporting wafers between said cassettes and said ion implantation process unit, said transporting means extending from said plurality of cassettes to the ion implantation process unit via each of said stockers, wherein each of said stockers comprises means for receiving unprocessed wafers from said cassettes and for receiving processed wafers from said ion implantation process unit; and
   (f) means for controlling the operation of said means for lifting and lowering each of said cassettes, wherein said controlling means, said means for lifting and lowering each of said stockers, and said means for reciprocally transporting wafers, together comprise means for collecting the wafers from a desired cassette and for replacing said wafers in the same cassette at a plurality of predetermined second positions therein after processing.

2. An end station as defined in claim 1, wherein the control means comprises means for giving an instruction so that wafers from the desired cassette are replaced into the same cassette at said plurality of second positions therein after having been treated in the process unit, wherein said plurality of first positions and said plurality of second positions are the same.

3. An end station as defined in claim 1, wherein the wafer holder in the ion implantation process unit for ion implantation comprises a disk for holding a plurality of wafers thereon.

4. An end station as defined in claim 3, wherein said disk comprises at least nine positions for holding said wafers thereon.

5. An end station as defined in claim 1, wherein the wafer holder in the ion implantation process unit comprises a platen for retaining wafers individually.

6. An end station as defined in claim 1, wherein the cassette comprises a rack structure.

7. An end station as defined in claim 1, wherein each said means for lifting and lowering each of said cassettes and each of said stockers comprises a driver and a lift portion operable by said driver.

8. An end station as defined in claim 1, wherein each of said stockers comprises a rack, said rack comprising a plurality of oppositely positioned shelf portions.

9. An end station as defined in claim 8, wherein each of said stockers further comprises means for stably retaining each of the wafers to be accommodated therein.

10. An end station as defined in claim 9, wherein said retaining means comprises a plurality of arc shaped recessed portions formed in said shelf portions.

11. An end station as defined in claim 1, wherein said means for transporting said wafers comprises a belt.

12. An end station as defined in claim 1, wherein each of said stockers comprises an upper shelf and a lower shelf, each of said upper shelves accommodates a plurality of dummy wafers and each of said lower shelves accommodates a plurality of wafers corresponding to at least the total number of wafers being accommodated in each of said cassettes.

13. An end station as defined in claim 1, wherein each of said cassettes accommodates at least twenty-five wafers.

14. An end station for an ion implantation apparatus comprising an ion implantation process unit having a wafer holder and capable of implanting ions in wafers in a high vacuum, and a wafer supply-collection unit for the process unit, the wafer supply-collection unit comprising:
   (a) a plurality of cassettes, each of said cassettes comprising means for accommodating a plurality of wafers in a plurality of first positions therein before ion implantation, at least one of said cassettes comprising a rack;
   (b) means for sequentially lifting and lowering each of said cassettes for delivery or accommodating individual wafers;
   (c) a plurality of stockers equal in number to the number of cassettes for accommodating wafers from said cassettes in a plurality of positions therein and for accommodating a plurality of dummy wafers, said dummy wafers comprising wafers which are not to be processed by said ion implantation process unit;
   (d) means for sequentially lifting and lowering each of said stockers for accommodating or delivering wafers individually;
   (e) means for reciprocally transporting wafers, said transporting means extending from said plurality of cassettes to the ion implantation process unit via each of said stockers, and comprising means for transporting wafers from said cassettes via said stockers to said ion implantation process unit; and
   (f) means for controlling the operation of said means for lifting and lowering each of said cassettes and said means for lifting and lower each of said stockers, wherein said controlling means, and said means for reciprocally transporting wafers, together comprise means for collecting the wafers from a desired cassette and for replacing said wafers in the same cassette at a plurality of second positions therein after processing, said stockers comprising means for receiving unprocessed wafers from said cassettes and for receiving processed wafers from said ion implantation process unit; wherein each of said stockers comprises means for supplying at least one of said dummy wafers to at least one position on said wafer holder to satisfy any numerical deficiency in the supply of said wafers from one of said cassettes.

15. An end station in accordance with claim 14, wherein each of said cassettes comprises means for accommodating at least 25 wafers in a plurality of first positions.

16. An end station in accordance with claim 15 wherein said wafer holder comprises means for holding at least 9 wafers such that only 9 wafers are processed at a single time.

17. An end station for an ion implantation apparatus in accordance with claim 14 wherein said plurality of first positions and said plurality of said second positions are identical.

* * * * *